US012610647B2

(12) United States Patent
Lee

(10) Patent No.: US 12,610,647 B2
(45) Date of Patent: Apr. 21, 2026

(54) IMAGE SENSOR DEVICE FOR BLOCKING NOISE IN THE PAD AREA

(71) Applicant: SK hynix Inc., Gyeonggi-do (KR)

(72) Inventor: Sung Ryong Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 569 days.

(21) Appl. No.: 18/106,423

(22) Filed: Feb. 6, 2023

(65) Prior Publication Data

US 2023/0187468 A1     Jun. 15, 2023

Related U.S. Application Data

(62) Division of application No. 17/007,906, filed on Aug. 31, 2020, now Pat. No. 11,605,664.

(30) Foreign Application Priority Data

Apr. 1, 2020     (KR) ........................ 10-2020-0039787

(51) Int. Cl.
*H10F 39/18* (2025.01)
*H10F 39/00* (2025.01)
(Continued)

(52) U.S. Cl.
CPC ........... *H10F 39/811* (2025.01); *H10F 39/18* (2025.01); *H10F 39/199* (2025.01); *H10F 39/802* (2025.01); *H10F 39/8037* (2025.01); *H10F 39/807* (2025.01); *H10W 20/20* (2026.01); *H04N 25/709* (2023.01)

(58) Field of Classification Search
CPC ...... H10F 39/811; H10F 39/18; H10F 39/199; H10F 39/802; H10F 39/8037; H10F 39/807; H01L 23/481; H04N 25/709
See application file for complete search history.

(56) References Cited

U.S. PATENT DOCUMENTS

| 5,477,078 A | * | 12/1995 | Beigel | .................... | H10D 8/411 |
| | | | | | 257/E29.328 |
| 5,952,704 A | | 9/1999 | Yu et al. | | |

(Continued)

FOREIGN PATENT DOCUMENTS

| CN | 102194837 A | 9/2011 | |
| CN | 102446939 A * | 5/2012 | ........... H10F 39/813 |

(Continued)

OTHER PUBLICATIONS

Notice of Allowance for the Chinese Patent Application No. 202010835318.7 issued by the Chinese Patent Office on Dec. 29, 2024.

(Continued)

*Primary Examiner* — Scott B Geyer
(74) *Attorney, Agent, or Firm* — IP & T GROUP LLP

(57) ABSTRACT
An image sensor device is disclosed, which blocks noise of a pad area. The image sensor device includes a substrate, a pad, and an impurity area. The substrate includes a first surface and a second surface, and includes first conductive impurities. The pad is disposed at the first surface of the substrate. The impurity area is formed in the substrate to overlap with the pad in a first direction, the impurity area being includes second conductive impurities different from the first conductive impurities.

15 Claims, 9 Drawing Sheets

(51) Int. Cl.
    H10F 39/12        (2025.01)
    H10W 20/20        (2026.01)
    H04N 25/709          (2023.01)

(56)                References Cited

U.S. PATENT DOCUMENTS

| | | | |
|---|---|---|---|
| 8,217,484 B2 * | 7/2012 | Park | H04N 23/57 |
| | | | 257/E21.627 |
| 8,569,856 B2 * | 10/2013 | Qian | H01L 23/481 |
| | | | 257/459 |
| 8,576,318 B2 | 11/2013 | Lee et al. | |
| 8,853,705 B2 | 10/2014 | Lee et al. | |
| 8,963,272 B2 | 2/2015 | Maekawa et al. | |
| 9,030,584 B2 | 5/2015 | Dai | |
| 9,666,630 B2 | 5/2017 | Chuang et al. | |
| 9,978,797 B2 | 5/2018 | Sasaki | |
| 10,672,823 B2 | 6/2020 | Shin et al. | |
| 10,971,537 B2 | 4/2021 | Shin et al. | |
| 2002/0036292 A1 | 3/2002 | Yamashita | |
| 2004/0141421 A1 | 7/2004 | Cheng et al. | |
| 2005/0090035 A1 * | 4/2005 | Kim | H10F 39/026 |
| | | | 257/431 |
| 2005/0247941 A1 * | 11/2005 | Adachi | H10F 39/186 |
| | | | 257/72 |
| 2006/0170009 A1 | 8/2006 | Kitano et al. | |
| 2007/0155106 A1 * | 7/2007 | Kim | H10F 39/024 |
| | | | 257/E21.352 |
| 2008/0191250 A1 | 8/2008 | Lee et al. | |
| 2008/0191297 A1 | 8/2008 | Yang et al. | |
| 2009/0085143 A1 | 4/2009 | Park | |
| 2009/0140365 A1 | 6/2009 | Lee et al. | |
| 2009/0321869 A1 * | 12/2009 | Fukuoka | H01L 24/06 |
| | | | 257/461 |
| 2010/0045837 A1 | 2/2010 | Yamashita | |
| 2010/0244175 A1 | 9/2010 | Park | |
| 2011/0042825 A1 | 2/2011 | Ito et al. | |
| 2011/0080511 A1 | 4/2011 | Lee et al. | |
| 2011/0084350 A1 * | 4/2011 | Murakoshi | H10F 39/807 |
| | | | 257/E31.127 |
| 2011/0186917 A1 * | 8/2011 | Akiyama | H10F 39/028 |
| | | | 257/292 |
| 2011/0227180 A1 | 9/2011 | Murakoshi | |
| 2012/0086092 A1 * | 4/2012 | Yanagita | H10F 39/014 |
| | | | 257/E31.127 |
| 2012/0146198 A1 | 6/2012 | Yang et al. | |
| 2012/0205723 A1 * | 8/2012 | Suzuki | H10F 39/803 |
| | | | 257/215 |
| 2012/0313208 A1 | 12/2012 | Kim et al. | |
| 2013/0020665 A1 | 1/2013 | Oganesian | |
| 2013/0107095 A1 | 5/2013 | Yarino et al. | |
| 2013/0140442 A1 * | 6/2013 | Yanagita | H10F 39/80373 |
| | | | 250/206 |
| 2013/0240960 A1 | 9/2013 | Kim et al. | |
| 2013/0249033 A1 | 9/2013 | Kim et al. | |
| 2013/0323875 A1 | 12/2013 | Park et al. | |
| 2013/0341694 A1 * | 12/2013 | Maekawa | H10F 77/334 |
| | | | 257/435 |
| 2014/0035089 A1 | 2/2014 | Qian et al. | |
| 2014/0070353 A1 | 3/2014 | Kim | |
| 2015/0008555 A1 * | 1/2015 | Mizuta | H10F 39/8067 |
| | | | 257/432 |
| 2015/0035103 A1 * | 2/2015 | Inoue | H10F 39/018 |
| | | | 438/69 |
| 2015/0048426 A1 | 2/2015 | Goto | |
| 2015/0255495 A1 | 9/2015 | Park | |
| 2015/0334322 A1 * | 11/2015 | Fujioka | H04N 25/68 |
| | | | 348/322 |
| 2015/0340400 A1 | 11/2015 | Takemoto et al. | |
| 2016/0172402 A1 | 6/2016 | Katkar | |
| 2016/0379960 A1 | 12/2016 | Huang et al. | |
| 2017/0040374 A1 | 2/2017 | Oh et al. | |

| | | | |
|---|---|---|---|
| 2018/0040553 A1 | 2/2018 | Tak et al. | |
| 2018/0061779 A1 | 3/2018 | Takazawa et al. | |
| 2018/0286922 A1 * | 10/2018 | Togashi | H01L 21/76898 |
| 2019/0043902 A1 | 2/2019 | Lee et al. | |
| 2019/0148439 A1 | 5/2019 | Shin et al. | |
| 2019/0348459 A1 | 11/2019 | Katkar | |
| 2019/0371839 A1 * | 12/2019 | Sato | H10F 39/811 |
| 2019/0386054 A1 | 12/2019 | Chuang et al. | |
| 2020/0119073 A1 * | 4/2020 | Machida | G02B 5/3058 |
| 2021/0043792 A1 | 2/2021 | Iwata | |

FOREIGN PATENT DOCUMENTS

| | | | | |
|---|---|---|---|---|
| CN | 102629614 A | 8/2012 | | |
| CN | 103094293 A | 5/2013 | | |
| CN | 106098717 A | 11/2016 | | |
| CN | 109786408 A | 5/2019 | | |
| CN | 109786411 A | 5/2019 | | |
| CN | 110100312 A | 8/2019 | | |
| CN | 110571230 A | 12/2019 | | |
| CN | 110854144 A | 2/2020 | | |
| JP | 2011-198966 A | 10/2011 | | |
| JP | 2013080838 A | 5/2013 | | |
| JP | 2017168531 A | * | 9/2017 | H01L 22/32 |
| KR | 20040092827 A | 11/2004 | | |
| KR | 100825803 B1 | * | 4/2008 | H10D 30/60 |
| KR | 10-1621241 B1 | 5/2016 | | |
| KR | 10-2017-0017170 A | 2/2017 | | |
| KR | 10-2019-0054769 A | 5/2019 | | |
| KR | 10-2020-0019384 A | 2/2020 | | |

OTHER PUBLICATIONS

Office Action for Korean Patent Application No. 10-2020-0039787 issued by the Korean Patent Office on Mar. 27, 2025.
Office Action for the U.S. Appl. No. 16/990,699 issued by the USPTO on Apr. 19, 2023.
"Bipolar Junction Transistor," Web page <https://en.wikipedia.org/wiki/Bipolar_Junction_transistor>, 12 pages, Mar. 15, 2019, retrieved from Internet Archive Wayback Machine <https://web.archive.org/web/20190326183710/https://en.wikipedia.org/wiki/Bipolar_Junction_transistor> on Aug. 16, 2022.
"Depletion Region," Web page <https://en.wikipedia.org/wiki/Depletion_region>, 5 pages, Feb. 11, 2016, retrieved from Internet Archive Wayback Machine <URL:https://web.archive.org/web/20161126221456/https://en.wikipedia.org/wiki/Depletion_region(Year:2016)> on Nov. 28, 2022.
Office Action for the U.S. Appl. No. 17/007,837 issued by the USPTO on Oct. 26, 2021.
Office Action for the U.S. Appl. No. 17/007,837 issued by the USPTO on Feb. 15, 2022.
Office Action for the U.S. Appl. No. 17/007,906 issued by the USPTO on Jun. 3, 2022.
Office Action for the U.S. Appl. No. 16/990,699 issued by the USPTO on Aug. 24, 2022.
Office Action for the U.S. Appl. No. 16/990,699 issued by the USPTO on Dec. 22, 2022.
Notice of Allowance for the U.S. Appl. No. 17/007,906 issued by the USPTO on Nov. 8, 2022.
Office Action for the Chinese Patent Application No. 202010835318.7 issued by the Chinese Patent Office on Dec. 27, 2023.
Office Action for the Chinese Patent Application No. 202010841254.1 issued by the Chinese Patent Office on Jan. 2, 2024.
Office Action for Korean Patent Application No. 10-2020-0039786 issued by the Korean Patent Office on Apr. 22, 2024.
Notice of Allowance for Chinese Patent Application No. 202010841254.1 issued by the Chinese Patent Office on Jul. 2, 2024.
Notice of Allowance for Korean Patent Application No. 10-2020-0039786 issued by the Korean Patent Office on Jul. 18, 2025.

* cited by examiner

IMAGE SENSOR DEVICE FOR BLOCKING NOISE IN THE PAD AREA

CROSS-REFERENCE TO RELATED APPLICATION

This application is a division of U.S. patent application Ser. No. 17/007,906 filed on Aug. 31, 2020, which claims priority under 35 U.S.C 119(a) to Korean patent application No. 10-2020-0039787, filed on Apr. 1, 2020, which is hereby incorporated in its entirety by reference.

TECHNICAL FIELD

The present Invention relates generally to image sensor technology and, more particularly, to a technology for blocking the noise or minimizing the parasitic capacitance of a pad area of an image sensor.

BACKGROUND

An image sensor converts an optical image into electrical signals. Recently, because of the increased research development in the computer and communication industries, demand for high-quality, high-performance image sensors is rapidly increasing in various applications and fields, such as, for example, digital cameras, camcorders, personal communication systems (PCSs), game consoles, surveillance cameras, medical micro-cameras, and the like.

Specifically, MOS image sensors can be driven more easily, and can be implemented using many more scanning schemes. The MOS image sensor may include one or more photoelectric conversion elements configured to sense the magnitude of incident light and a multilayer metal line layer configured to output light signals stored in the photoelectric conversion elements. However, the incident light may be reflected by the metal line layer, and may be absorbed by an interlayer insulation film, resulting in reduction in sensitivity. In addition, the reflected light may be absorbed into contiguous (or adjacent) pixels, resulting in occurrence of crosstalk.

SUMMARY

Various embodiments of the disclosed technology relate to an image sensor device for reducing noise and parasitic capacitance of a pad area. The image sensor may be a BSI image sensor.

In accordance with an embodiment of the disclosed technology, an image sensor device may include a substrate including a first surface and a second surface, the substrate being configured to have first conductive impurities, a pad disposed at the first surface of the substrate, and an impurity area formed in the substrate to overlap with the pad in a first direction, the impurity area being configured to have second conductive impurities different from the first conductive impurities.

In accordance with another embodiment of the disclosed technology, an image sensor device may include a substrate including a first surface and a second surface, the substrate being configured to have first conductive impurities, a pad disposed at the first surface of the substrate, and an impurity area including second conductive impurities different from the first conductive impurities, and disposed at both ends of the substrate with respect to a first direction within the substrate.

In accordance with still another embodiment of the disclosed technology, an image sensor device may include a substrate in which a pad area and a circuit area adjacent to the pad area are defined, configured to include first conductive impurities, a pad disposed at a first surface of the substrate in the pad area, and an impurity area formed below the pad in the pad area, configured to have second conductive impurities different from the first conductive impurities, and formed in the substrate.

It is to be understood that both the foregoing general description and the following detailed description of the disclosed technology are illustrative and explanatory and are intended to provide further description of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
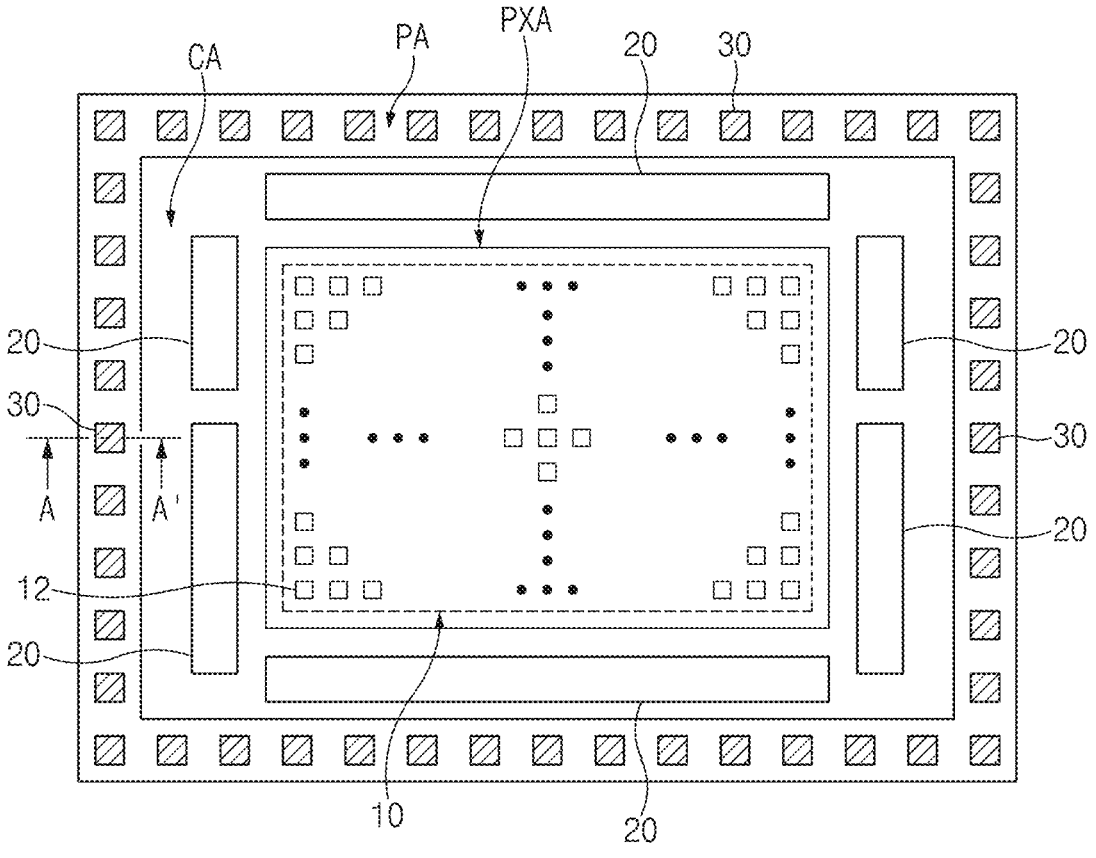
FIG. 1 is a schematic plan view illustrating an example of an image sensor device based on various implementations of the disclosed technology.

Various implementations and examples of an image sensor device are provided that address one or more issues due to limitations and disadvantages of the related art. Various implementations of the disclosed technology are directed to an image sensor device capable of reducing or blocking pad area noise and parasitic capacitance, and for addressing the aforementioned issues of existing technology.

Reference will now be made in detail to embodiments of the disclosed technology, examples of which are illustrated in the accompanying drawings. Wherever possible, the same reference numbers are used throughout the drawings to refer to the same or like portions.

Advantages and features of the disclosed technology and a method of achieving the advantages and features of the disclosed technology will be clearly understood from embodiments described hereinafter in conjunction with the accompanying drawings. However, the disclosed technology is not limited to the following embodiments and may be realized in various different forms. These embodiments are provided only to completely disclose the technology and for a person having ordinary skill in the art to which the disclosed technology pertains to completely understand the disclosure. That is, the disclosed technology is defined only by the claims. In the drawings, the sizes or relative sizes of layers and areas may be exaggerated for clarity of description.

The terminology used herein is for the purpose of describing particular embodiments only and is not intended to be limiting of the disclosed technology. As used herein, the singular forms are intended to include the plural forms as well, unless the context clearly indicates otherwise. It will be further understood that the terms "comprises" "comprising," "includes", and/or "including" when used in this specification, specify the presence of stated constituent elements, steps, operations, and/or components, but do not preclude the presence or addition of one or more other constituent elements, steps, operations, and/or components thereof. The term "and/or" may include a combination of a plurality of items or any one of a plurality of items. The same reference numbers will be used throughout this specification to refer to the same or like constituent elements.

In the description of the disclosed technology, the terms "first", "second" and the like may be used to describe various elements, components, and/or sections, but the elements, components, and/or sections are not limited by these terms. These terms may be used to distinguish one component, one constituent element, or one section from another component, another constituent element, or another section. Therefore, a first element, a first constituent element, or a first section may also be called a second element, a second constituent element, or a second section without departing from the scope of the disclosed technology.

When an element or a layer is referred to as being "on" another element or another layer, it can be directly on the element or the layer, or one or more intervening elements or layers may also be present. In contrast, when an element or a layer is referred to as being "directly on" another element or another layer, it means that no intervening elements or layers are present. The term "and/or" may include a combination of a plurality of items or any one of a plurality of items.

Spatially relative terms such as "below," "beneath," "lower," "above," or "upper" may be used herein to describe one element's relationship to another element as illustrated in the drawings. It will be understood that spatially relative terms are intended to encompass different orientations of the elements during the use or operation of the elements in addition to the orientation depicted in the drawings. Wherever possible, the same reference numbers will be used throughout the specification to refer to the same or like elements.

Furthermore, the embodiments described herein may be understood with reference to various cross-sectional views and plan views. Accordingly, forms of the diagrams may be changed by fabrication technology and/or tolerance. Accordingly, the embodiments of the disclosed technology are not limited to the illustrated specific forms, but may include changes in forms generated according to a fabrication process. Accordingly, areas illustrated in the drawings have schematic attributes, and the shapes of the illustrated areas are intended to illustrate a specific form of an area of the element (or device) but are not intended to limit the scope of the disclosed technology.

Figure 2:
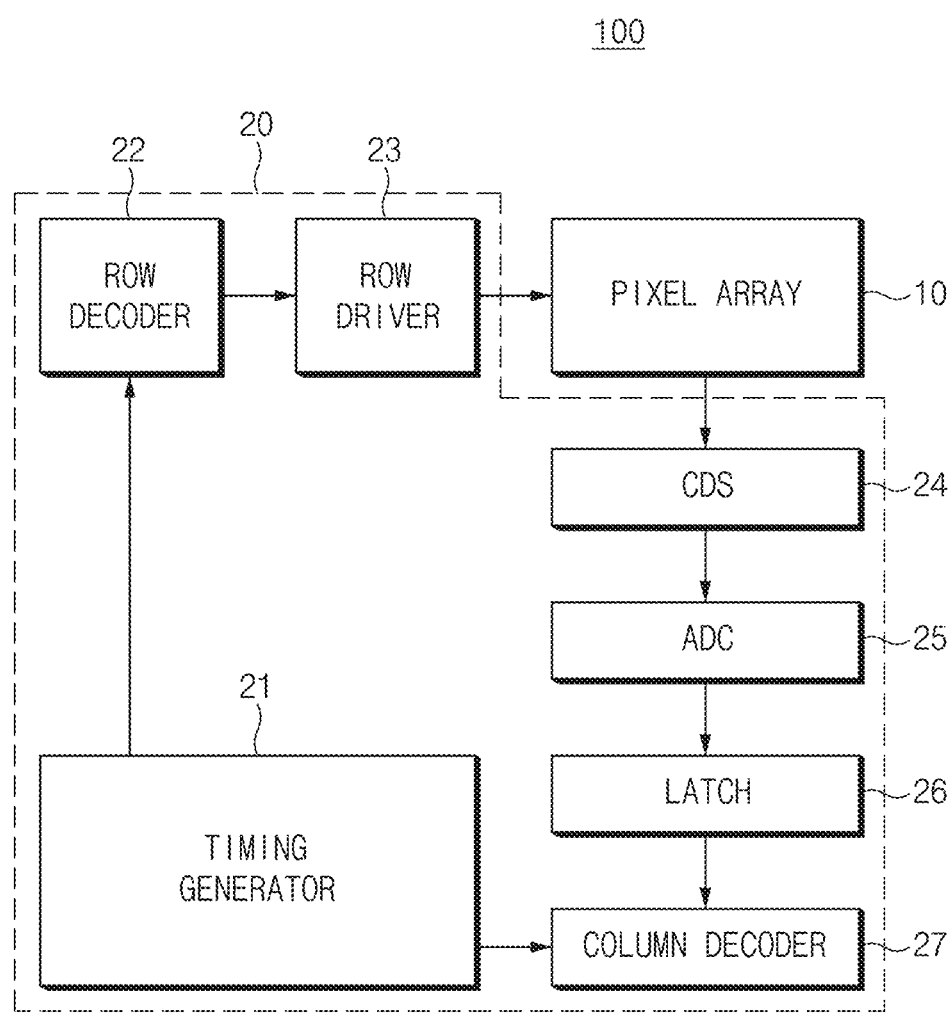
FIG. 2 is a block diagram illustrating an example of some constituent elements of an image sensor device based on various implementations of the disclosed technology.

FIG. 1 is a schematic plan view illustrating an example of an image sensor device 100 based on various implementations of the disclosed technology. FIG. 2 is a block diagram illustrating an example of some constituent elements of the image sensor device 100 based on various implementations of the disclosed technology.

Referring to FIGS. 1 and 2, the image sensor device 100 may include a pixel area PXA, a circuit area CA, and a pad area PA.

The pixel area PXA may include a pixel array 10 in which a plurality of unit pixels 12 are arranged in a matrix shape. Each of the plurality of unit pixels 12 may include a photoelectric conversion element (not shown).

The circuit area CA may be formed around the pixel area PXA, and may include a plurality of circuits 20. The circuit area CA may include a plurality of CMOS transistors (not shown). The circuit area CA may transmit a predetermined signal to each unit pixel 12 of the pixel array 10, or may control an output signal at each unit pixel 12. The pad area PA may include a plurality of pads 30 located contiguous to the circuit area CA. The plurality of pads 30 may be spaced apart from each other in a single file in the pad area PA as shown in FIG. 1 for example. However, the invention may not be limited in this way. For example, in other implementations of the invention a double file or other configurations of the pads 30 may be employed.

Referring to FIG. 1, the circuit area CA may be defined to surround the pixel area PXA, and the pad area PA may be defined to surround the circuit area CA, without being limited thereto. For example, in variations of the described implementations, the circuit area CA may not surround the pixel area PXA. Also, the pad area PA may be formed at fewer than all the sides of the circuit area. For example, the pad area may be formed only at three sides, or only at two skies or only at one side of the circuit area CA. In an implementation, for example, the circuit area CA may not surround the pixel area PXA and the pad area PA may be formed only at one side of the circuit area CA.

Referring to FIG. 2, the plurality of circuits 20 formed in the circuit area CA may include a timing generator 21, a row decoder 22, a row driver 23, a correlated double sampler (CDS) circuit 24, an analog-to-digital converter (ADC) circuit 25, a latch circuit 26, and a column decoder 27.

The pixel array 10 included in the pixel area PXA may receive a plurality of drive signals, for example, a row selection signal, a reset signal, a charge transfer signal, etc., from the row driver 23, and may be driven by the received drive signals. In addition, electrical signals acquired by photoelectric conversion in the pixel array 10 may be provided to the CDS circuit 24.

The timing generator 21 may transmit a timing signal and control signals to the row decoder 22 and the column decoder 27. Upon receiving the decoded result from the row decoder 22, the row driver 23 may transmit a plurality of drive signals needed to drive the plurality of unit pixels 12 to the pixel array 10 of the pixel area PXA. If the plurality of unit pixels 12 is arranged in a matrix, the row driver 23 may provide a drive signal for each row of the matrix.

The CDS circuit 24 may receive output signals from the pixel array 10 of the pixel area PXA, and may hold and sample the received output signals. That is, the CDS circuit 24 may perform double sampling of a signal level caused by each output signal and a specific noise level, and may thus output a level difference corresponding to a difference between the noise level and the signal level.

The ADC circuit 25 may convert an analog signal corresponding to the level difference into a digital signal, and may thus output the digital signal. The latch circuit 26 may latch digital signals, and the latched signals may be sequentially output to an image signal output circuit (not shown) in response to the decoded result acquired by the column decoder 27.

In some implementations, the image sensor device 100 may be a backside illuminated (BSI) image sensor. In addition, light may be incident upon the pixel area PXA from the same surface as an exposure surface on which the plurality of pads 30 is exposed to the outside from among a plurality of exposure surfaces of the image sensor device 100.

The plurality of pads 30 may be electrically coupled to a plurality of wells formed in the circuit area CA through connection lines. In some implementations, the plurality of pads 30 may be formed of metal, metal nitride, or a combination thereof. In some implementations, the plurality of pads 30 formed in the pad area PA may transmit and receive electrical signals to and from an external device. In other implementations, the plurality of pads 30 may serve to transfer a driving power source, such as a power-supply voltage or a ground voltage received from the outside, to circuits included in the circuit area CA through a connection line.

Figure 3:
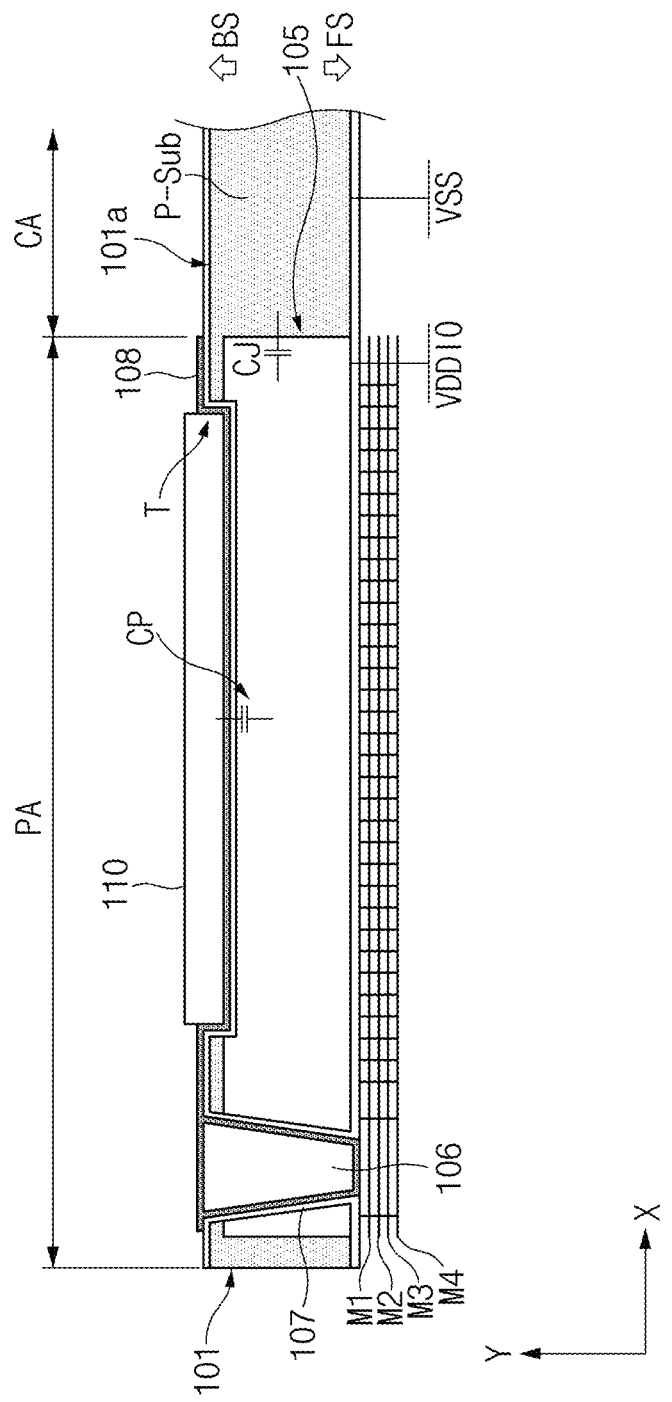
FIG. 3 is a cross-sectional view illustrating an example of a pad of the image sensor device shown in FIG. 1 based on various implementations of the disclosed technology.

FIG. 3 is a cross-sectional view illustrating an example of the image sensor device 100 shown in FIG. 1 based on various implementations of the disclosed technology. In more detail, FIG. 3 is a cross-sectional view illustrating the pad area PA taken along the line A-A' in the image sensor device 100 shown in FIG. 1.

Referring to FIG. 3, a circuit area CA and a pad area PA may be defined in a substrate 101 adjacent to each other in a first direction X. For convenience of description, the substrate of the pad area PA including a pad 110 will hereinafter be denoted by reference number "101", and the substrate of the circuit area CA will hereinafter be denoted by reference number "101*a*". The circuit area CA and the pad area PA may be adjacent to each other in a first direction X.

The substrate 101 may include a front side (FS) and a back side (BS) that are arranged to face each other. One side of the substrate 101 can be defined as the front side (FS) and the other side of the substrate 101 can be defined as the back side (BS), without being limited thereto. For example, unit elements may be formed over the front side (FS) of the substrate 101, and light may be emitted to the back side (BS) of the substrate 101.

The substrate 101 may be any suitable substrate. For example, the substrate 101 may be a P-type bulk substrate. Also, for example, the substrate 101 may be an N-type bulk substrate. The substrate may include growing an epitaxial layer on the bulk substrate. The epitaxial layer may be a P-type epitaxial layer. The epitaxial layer may be an N-type epitaxial layer. For example, the substrate may be a substrate formed by growing a P-type or N-type epitaxial layer on an N-type bulk substrate or on a P-type bulk substrate. The substrate 101 may be formed of an organic plastic substrate rather than a semiconductor substrate. Examples of organic plastic substrates may include substrates made of organic small molecules or polymers. Organic small molecules may include, for example, polycyclic aromatic compounds, such as pentacene, anthracene, and rubrene. Suitable polymers may include, for example, fluoropolymers such as PVDF (polyvinylidene fluoride) or PVDF copolymers such as PVDF copolymers with trifluoroethylene. In some implementations, a P well 102 may be formed at the front side (FS) contained in the P-type substrate 101.

A plurality of lines M1~M4 for signal transmission may be disposed over the front side (FS) of the substrate 101. The plurality of lines M1~M4 may be sequentially stacked over an interlayer insulation film (not shown). In this case, each of the plurality of lines M1~M4 may include metal. For example, the plurality of lines M1~M4 may include copper (Cu), platinum (Pt), tungsten (W), aluminum (Al), an alloy layer formed of the above materials, and the like. The number of layers of the plurality of lines M1~M4 and structure types of the plurality of lines M1~M4 may not be limited thereto, and the plurality of lines M1~M4 may be formed in various numbers of layers and various types of structures according to device design methods.

A conductive film 108 may be disposed over the back side (BS) of the substrate 101. The conductive film 108 may be formed over the substrate 101. The conductive film 108 may be formed to cover a top surface of the back side (BS) of the substrate 101. The conductive film 108 may be formed to be longer than the pad 110 in the X-axis direction parallel to the substrate 101. In an embodiment, the conductive film 108 may be formed to be in direct contact with the top surface of the back side (BS) of the substrate 101. The conductive film 108 may be formed to be thinner than the pad 110 in a Y-axis direction. The Y-axis may be vertical to the X-axis. The conductive film 108 may extend to cover, at least partially, both sides of the pad 110, and may be coupled to a top surface of a through silicon via (TSV) 106. The conductive film 108 may be disposed in a trench (T) formed to expose some parts of the back side (BS) of the substrate 101.

The conductive film 108 may be formed to prevent the substrate 101 from being damaged in a patterning process for forming the pad 110. For example, the conductive film 108 may include metal, such as, for example, tungsten (W).

The pad 110 may be disposed over the conductive film 108 of the substrate 101. In an embodiment, the pad 110 may be formed directly on the conductive film 108 of the substrate 101. The pad 110 may be a constituent element corresponding to the pad 30 shown in FIG. 1. The pad 110 may be formed along a top surface and sidewalls of the conductive film 108 which may be formed conformally in the trench (T). In addition, the pad 110 and the plurality of lines M1~M4 may be electrically coupled to each other by the through silicon via (TSV) formed to penetrate the substrate 101. In this case, the pad 110 may include metal materials, for example, aluminum (Al), copper (Cu), and the like.

An insulation layer 107 may be formed at sidewalls of the through silicon via (TSV) 106, and may also be formed below the conductive film 108. The insulation layer 107 may be formed as an isolation pattern by which the through silicon via (TSV) 106 and the substrate 101 can be electrically isolated from each other. The insulation layer 107 may be formed to prevent the through silicon via (TSV) 106 and the conductive film 108 from being electrically coupled to (i.e., from being short-circuited to) the substrate 101.

In this case, the insulation layer 107 may be formed of only one insulation material. In another example, the insulation layer 107 may be formed by stacking at least two insulation patterns. The insulation layer 107 may be formed of oxide materials such as silicon oxide and metal oxide, or may be formed of nitride materials such as silicon nitride.

The through silicon via (TSV) 106 may be formed at one side of the substrate 101, and may be formed to penetrate the substrate 101. A bottom surface of the through silicon via (TSV) 106 may be in contact with the plurality of lines M1~M4. The through silicon via (TSV) 106 may have a sidewall slope in a manner that an inner width of the through silicon via (TSV) 106 becomes smaller in a downward direction from the back side (BS) of the substrate 101. Alternatively, although not shown in the drawings, the through silicon via (TSV) 106 may also have a vertical sidewall slope as necessary.

A contact hole (not shown) penetrating the substrate 101 may be formed, and the contact hole (not shown) may be filled with a conductive material, resulting in formation of the through silicon via (TSV) 106. The through silicon via (TSV) 106 may also be formed to fill the contact hole (not shown), and may also be conformally formed along sidewalls of the contact hole. The through silicon via (TSV) 106 may be formed in any shape by which the conductive film 108 can be easily coupled to the plurality of lines M1~M4.

The image sensing device 100 based on some implementations of the disclosed technology may include a noise-blocking impurity area 105 in a substrate 101 disposed below the pad 110. That is, the image sensing device 100 based on some implementations of the disclosed technology may be formed as a second conductive (e.g., N-type) doped area of the substrate 101 disposed below the pad 110 through impurity implantation.

Generally, the circuit area CA may not be disposed in a lower area of the pad 110 so as to prevent physical damage, and the lower area of the pad 110 is doped with the same type of conductive materials as in the substrate 101. In this case, parasitic capacitance may be formed between the pad 110 and the substrate 101.

Specifically, in the case of using the backside illuminated (BSI) image sensor, signals applied to the pad 110 may be transferred to lower lines M1~M4 through the through silicon via (TSV) 106. Therefore, excessive capacitance may be formed between the pad 110 and the substrate 101. If such capacitance between the pad 110 and the substrate 101 increases, transition of one or more input signals may become slower in speed. In addition, if a fast digital transition signal is input to the pad 110, noise may be introduced into the substrate 101 through the pad 110.

The image sensor device 100 may include the impurity area 105 in the substrate 101, such that parasitic capacitance generated between the pad 110 and the substrate 101 can be reduced.

First parasitic capacitance (CP) may be generated by the insulation layer 107 (i.e., dielectric materials) present between the pad 110 and the substrate 101. In this case, when the substrate 101 disposed below the pad 110 is doped with the second conductive (e.g., N-type) materials, second parasitic capacitance (CJ) caused by a reverse PN junction may occur in a boundary area between the impurity area 105 and the substrate 101a.

That is, a depletion area of a PN junction may be formed in the boundary area between the impurity area 105 and the substrate 101a, such that the second parasitic capacitance (CJ) may occur. The first parasitic capacitance (CP) and the second parasitic capacitance (CJ) may be coupled in series.

That the boundary area between the pad 110 and the substrate 101 may be relatively large in size, and the other boundary area between the impurity area 105 and the substrate 101a may be relatively small in size. Therefore, the second parasitic capacitance (CJ) may be less than the first parasitic capacitance (CP).

That is, the first parasitic capacitance (CP) having relatively higher capacitance may be coupled in series to the second parasitic capacitance (CJ) having relatively lower capacitance. Therefore, the total capacitance between the pad 110 and the substrate 101 may be significantly reduced as compared to the case in which only the first parasitic capacitance (CP) is present. In other words, total capacitance of the substrate 101 may be reduced by the second parasitic capacitance (CJ) having a lower capacitance value from among the first parasitic capacitance (CP) and the second parasitic capacitance (CJ). Hence, as a thickness of the depletion area of the PN junction in the second parasitic capacitance (CJ) is greater than a thickness of the dielectric materials of the substrate 101, the total capacitance generated in the substrate 101 may be reduced.

In some other implementations, a bias voltage may be applied between the pad 110 and each of the substrates 101 and 101a, such that noise between the pad 110 and the substrates 101 and 101a can be reduced. For example, a first well bias may be applied to the image sensor device through the substrate 101a. In addition, a second well bias may be applied to the image sensor device through the impurity area 105 of the substrate 101. The first well bias may be different in voltage level from the second well bias.

For example, when the impurity area 105 is formed of the second conductive (e.g., N-type) materials, the second well bias may be a power-supply voltage (VDDIO). When the substrate 101a is formed of the first conductive (e.g., P-type) materials, the first well bias may be a ground voltage (VSS). Therefore, coupling between the pad 110 and the substrate 101 is cut off, such that noise to be introduced into the substrate 101 through the pad 110 can be reduced.

Figure 4:
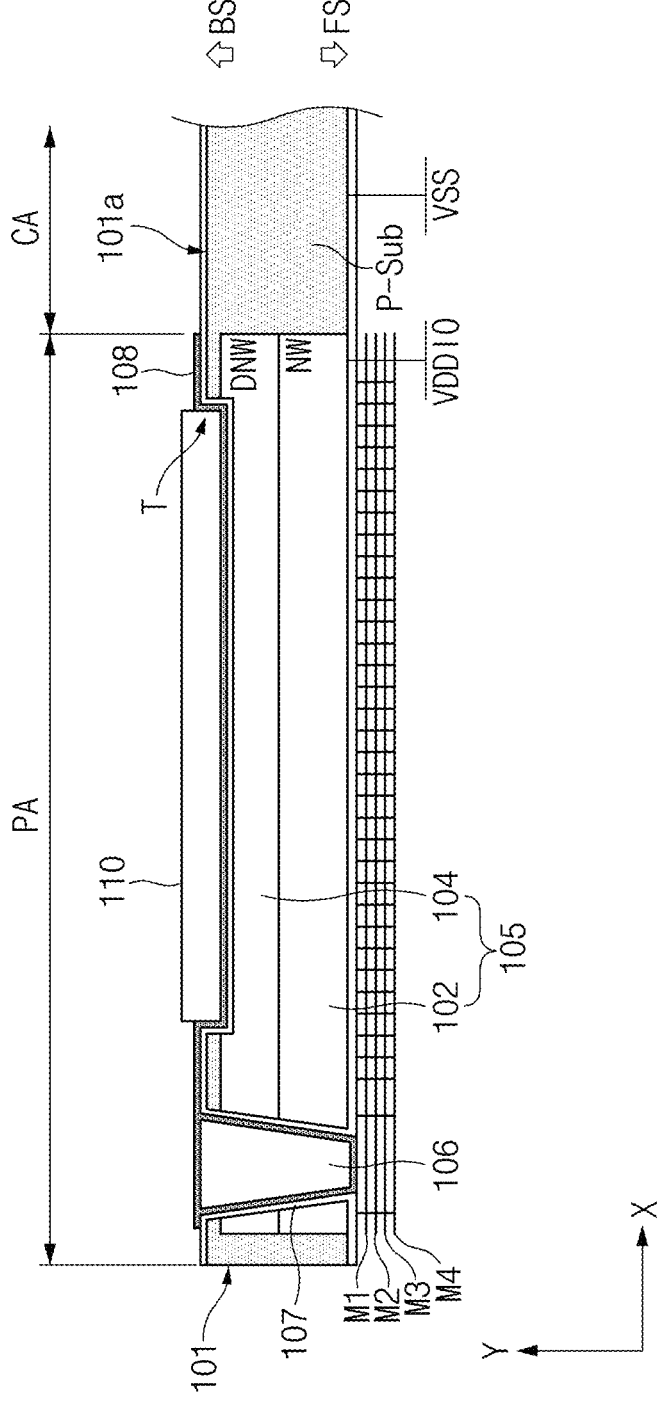
FIGS. 4 to 8 are cross-sectional views illustrating other examples of the pad of the image sensor device shown in FIG. 1 based on various implementations of the disclosed technology.

FIG. 4 is a cross-sectional view illustrating another example of the image sensor device shown in FIG. 1 based on various implementations of the disclosed technology. In FIG. 4, the same constituent elements as those of FIG. 3 will be used to refer to the same or like parts for convenience of description and better understanding of the disclosed technology, and as such redundant matters thereof will herein be omitted for brevity.

Referring to FIG. 4, the impurity area 105 may be formed by stacking a plurality of doped areas. For example, the impurity area 105 may include an impurity layer (NW) 102 and another impurity layer (DNW) 104.

During an impurity implantation process for implanting impurities into circuits (e.g., transistors) contained in the circuit area (CA), the second conductive (e.g., N-type) impurities may be implanted into the impurity area 105 through the front side (FS) of the substrate 101.

The substrate 101 may Include the first conductive (e.g., P-type) impurities. The second conductive (e.g., N-type) impurity layer 102 and the other second conductive (e.g., N-type) impurity layer 104 may be formed in the substrate 101. In this case, the impurity layers 102 and 104 may have various kinds of arrangements, shapes, densities, etc. as necessary.

In some implementations, the impurity layer 104 may be stacked over the impurity layer 102. The impurity layer 102 and the other impurity layer 104 may be formed to have the same dimension in an X-axis direction. Each of the impurity layer 102 and the impurity layer 104 may be larger than the pad 110 in the X-axis direction, i.e. may have a larger dimension in the X-axis direction than the X-axis dimension of the pad 110. The impurity layer 102 and the impurity layer 104 may have the same second conductive (e.g., N-type) impurities. The impurity layer 102 and the impurity layer 104 may have conductive materials different from those of the substrate 101. The impurity layer 104 may be formed as a deep well.

Figure 5:
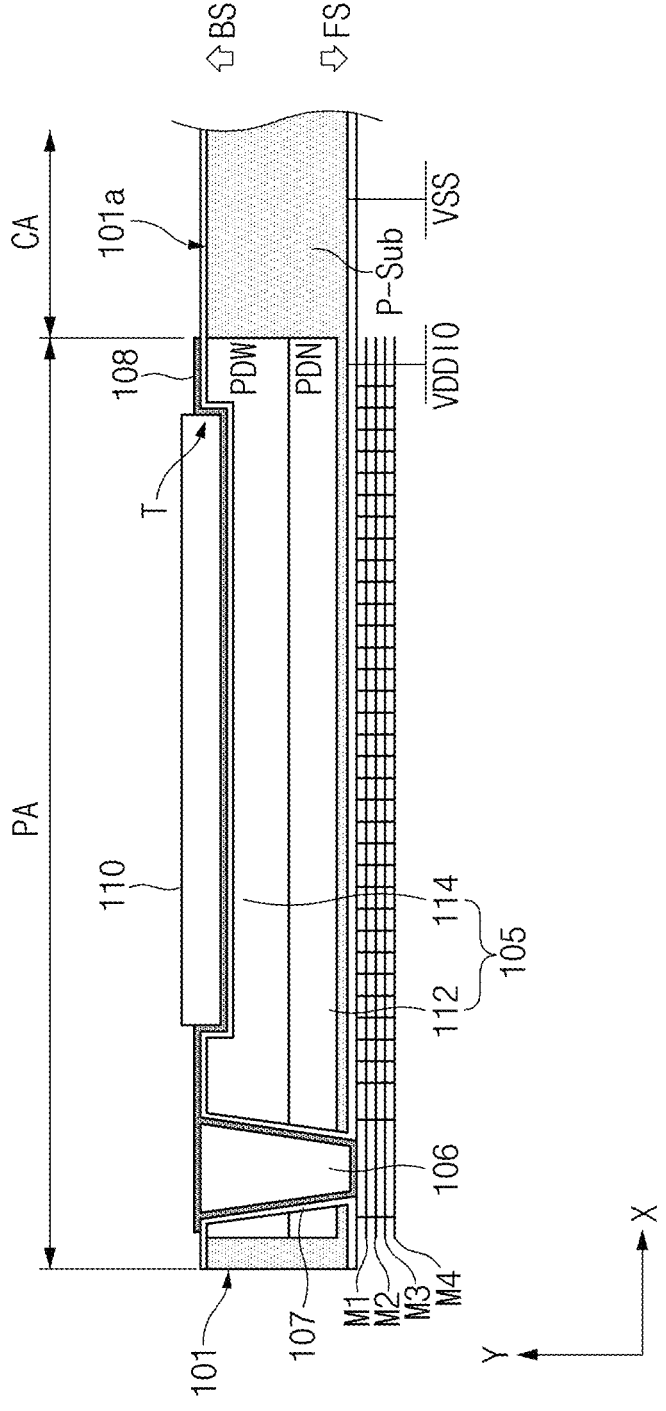

FIG. 5 is a cross-sectional view illustrating another example of the image sensor device shown in FIG. 1 based on some implementations of the disclosed technology. In FIG. 5, the same constituent elements as those of FIG. 3 will be used to refer to the same or like parts for convenience of description and better understanding of the disclosed technology, and as such redundant matters thereof will herein be omitted for brevity.

Referring to FIG. 5, the impurity area 105 may be formed as the second conductive (e.g., N-type) doped area. In FIG. 5, during the impurity implantation process for implanting impurities into a photoelectric conversion element (not shown) contained in the pixel area PXA, the second conductive (e.g., N-type) impurities may be implanted into the impurity area 105 in the direction of any one of the front side (FS) and the back side (BS) of the substrate 101. That is, a separate process to form the impurity area 105 need not be used, and the impurity area 105 can be formed simultaneously with the impurity implantation process of the pixel area PXA.

The photoelectric conversion element (not shown) may include a photodiode (PD) that accumulates photocharges generated in response to incident light in an inner area thereof. The photodiode (PD) may be an example of the photoelectric conversion element, and may be implemented as a photodiode, a phototransistor, a photogate, a pinned photodiode (PPD), or a combination thereof.

In some implementations, the impurity area 105 may be formed as a stacked structure of a plurality of doped areas. For example, the impurity area 105 may include an impurity layer (PDN) 112 and an impurity layer (PDW) 114.

The substrate 101 may include the first conductive (e.g., P-type) impurities. The second conductive (e.g., N-type) impurity layer 112 and the other second conductive (e.g., N-type) impurity layer 114 may be formed in the substrate 101. In this case, the impurity layers 112 and 114 may have various kinds of arrangements, shapes, densities, etc. as necessary.

In some implementations, the impurity layer 114 may be stacked over the impurity layer 112. The impurity layer 112 and the other impurity layer 114 may be formed to have the same dimension in an X-axis direction. Each of the impurity layer 112 and the impurity layer 114 may be larger than the pad 110 in the X-axis direction. The impurity layer 112 and the impurity layer 114 may have the same second conductive (e.g., N-type) impurities. The impurity layer 112 and the impurity layer 114 may have conductive materials different from those of the substrate 101.

Figure 6:
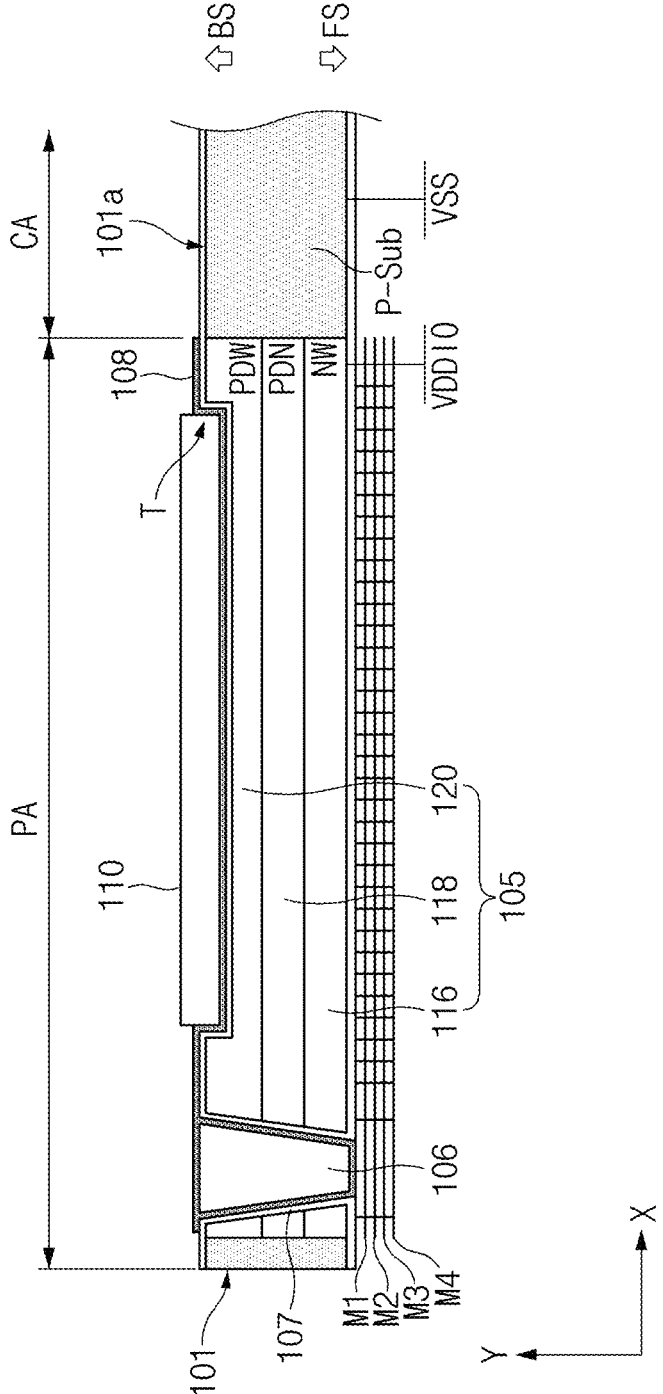

FIG. 6 is a cross-sectional view illustrating another example of the image sensor device shown in FIG. 1 based on various implementations of the disclosed technology. In FIG. 6, the same constituent elements as those of FIG. 3 will be used to refer to the same or like parts for convenience of description and better understanding of the disclosed technology, and as such redundant matters thereof will herein be omitted for brevity.

Referring to FIG. 6, in order to allow the impurity area 105 to be formed of the second conductive (e.g., N-type) impurities, impurities may be implanted into the front side (FS) and the back side (BS) of the substrate 101. That is, during the impurity implantation process for implanting impurities into the circuit area (CA), the second conductive (e.g., N-type) impurities may be implanted into the impurity area 105 in the direction of any one of the front side (FS) and the back side (BS) of the substrate 101. In addition, during the impurity implantation process for implanting impurities into the pixel area (PXA), the second conductive (e.g., N-type) impurities may be implanted into the impurity area 105 through the back side (BS) of the substrate 101.

In some implementations, the impurity area 105 may be formed as a stacked structure of a plurality of doped areas. For example, the impurity area 105 may include an impurity layer (NW) 116, an impurity layer (PDN) 118, and an impurity layer (PDW) 120. In this case, the impurity layer 116 may be formed of impurities implanted into the front side (FS) of the substrate 101, and each of the impurity layers 118 and 120 may be formed of impurities implanted into the back side (BS) of the substrate 101.

The substrate 101 may include the first conductive (e.g., P-type) impurities. The second conductive (e.g., N-type) impurity layer 116, the second conductive (e.g., N-type) impurity layer 118, and the second conductive (e.g., N-type) impurity layer 120 may be formed in the substrate 101. In this case, the impurity layers 116, 118, and 120 may have various kinds of arrangements, shapes, densities, etc. as necessary.

In some implementations, the impurity layer 118 and the impurity layer 120 may be sequentially stacked over the impurity layer 116. The impurity layer 116, the impurity layer 118, and the impurity layer 120 may be formed to have the same dimension in the X-axis direction. Each of the impurity layer 116, the impurity layer 118, and the impurity layer 120 may be larger than the pad 110 in the X-axis direction. The impurity layer 116, the impurity layer 118, and the impurity layer 120 may have the same second conductive (e.g., N-type) impurities. The impurity layer 116, the impurity layer 118, and the impurity layer 120 may have conductive materials different from those of the substrate 101.

Figure 7:
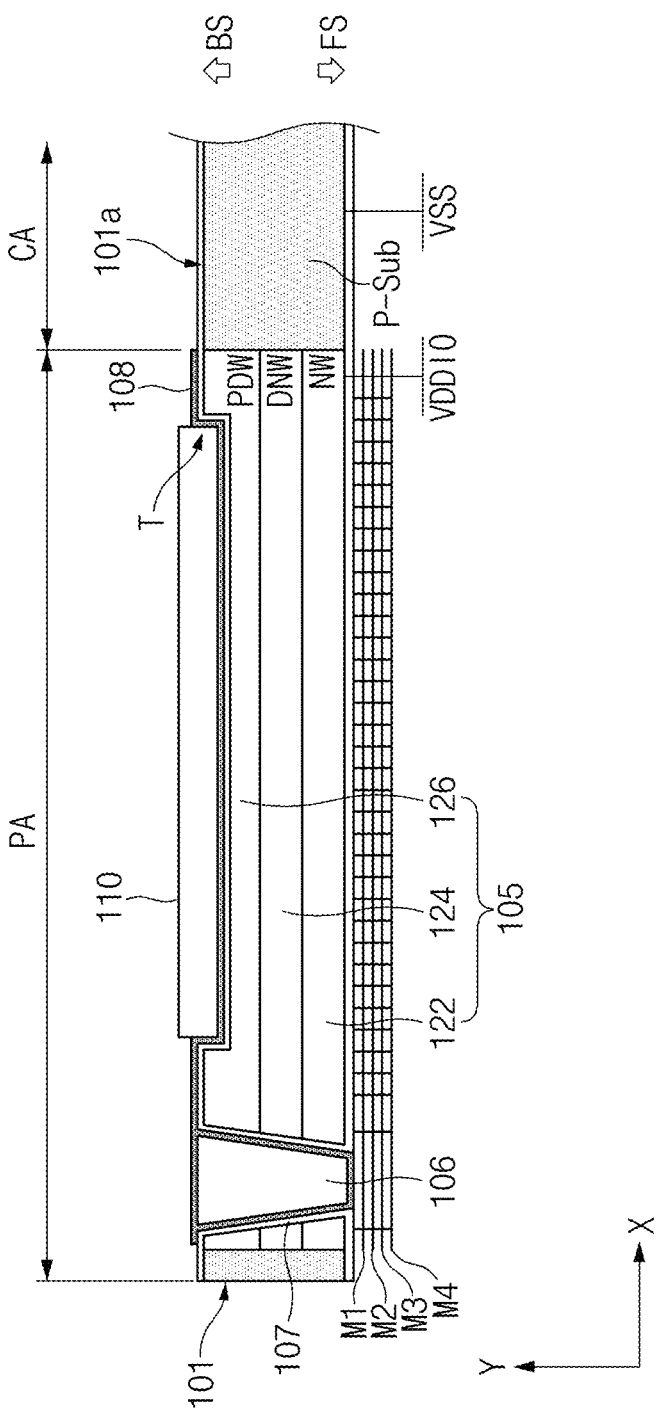

FIG. 7 is a cross-sectional view illustrating another example of the image sensor device shown in FIG. 1 based on various implementations of the disclosed technology. In FIG. 7, the same constituent elements as those of FIG. 3 will be used to refer to the same or like parts for convenience of description and better understanding of the disclosed technology, and as such redundant matters thereof will herein be omitted for brevity.

Referring to FIG. 7, in order to allow the impurity area 105 to be formed of the second conductive (e.g., N-type) impurities, impurities may be implanted into the front side (FS) and the back side (BS) of the substrate 101. That is, during the impurity implantation process for implanting impurities into the circuit area (CA), the second conductive (e.g., N-type) impurities may be implanted into the impurity area 105 in the direction of any one of the front side (FS) and the back side (BS) of the substrate 101. In addition, during the impurity implantation process for implanting impurities into the pixel area (PXA), the second conductive (e.g., N-type) impurities may be implanted into the impurity area 105 in the direction of any one of the front side (FS) and the back side (BS) of the substrate 101.

In some implementations, the impurity area 105 may be formed as a stacked structure of a plurality of doped areas. For example, the impurity area 105 may include an impurity layer (NW) 122, an impurity layer (DNW) 124, and an impurity layer (PDW) 126. In this case, the impurity layers 122 and 124 may be formed of impurities implanted into the front side (FS) of the substrate 101, and the impurity layer 126 may be formed of impurities implanted into the back side (BS) of the substrate 101.

The substrate 101 may include the first conductive (e.g., P-type) impurities. The second conductive (e.g., N-type) impurity layer 122, the second conductive (e.g., N-type) impurity layer 124, and the second conductive (e.g., N-type) impurity layer 126 may be formed in the substrate 101. In this case, the impurity layers 122, 124, and 126 may have various kinds of arrangements, shapes, densities, etc. as necessary.

In some implementations, the impurity layer 124 and the impurity layer 126 may be sequentially stacked over the impurity layer 122. The impurity layer 122, the impurity layer 124, and the impurity layer 126 may be formed to have the same dimension in the X-axis direction. Each of the impurity layer 122, the impurity layer 124, and the impurity layer 126 may be larger than the pad 110 in the X-axis direction. The impurity layer 122, the impurity layer 124, and the impurity layer 126 may have the same second conductive (e.g., N-type) impurities. The impurity layer 122, the impurity layer 124, and the impurity layer 126 may have conductive materials different from those of the substrate 101.

Figure 8:
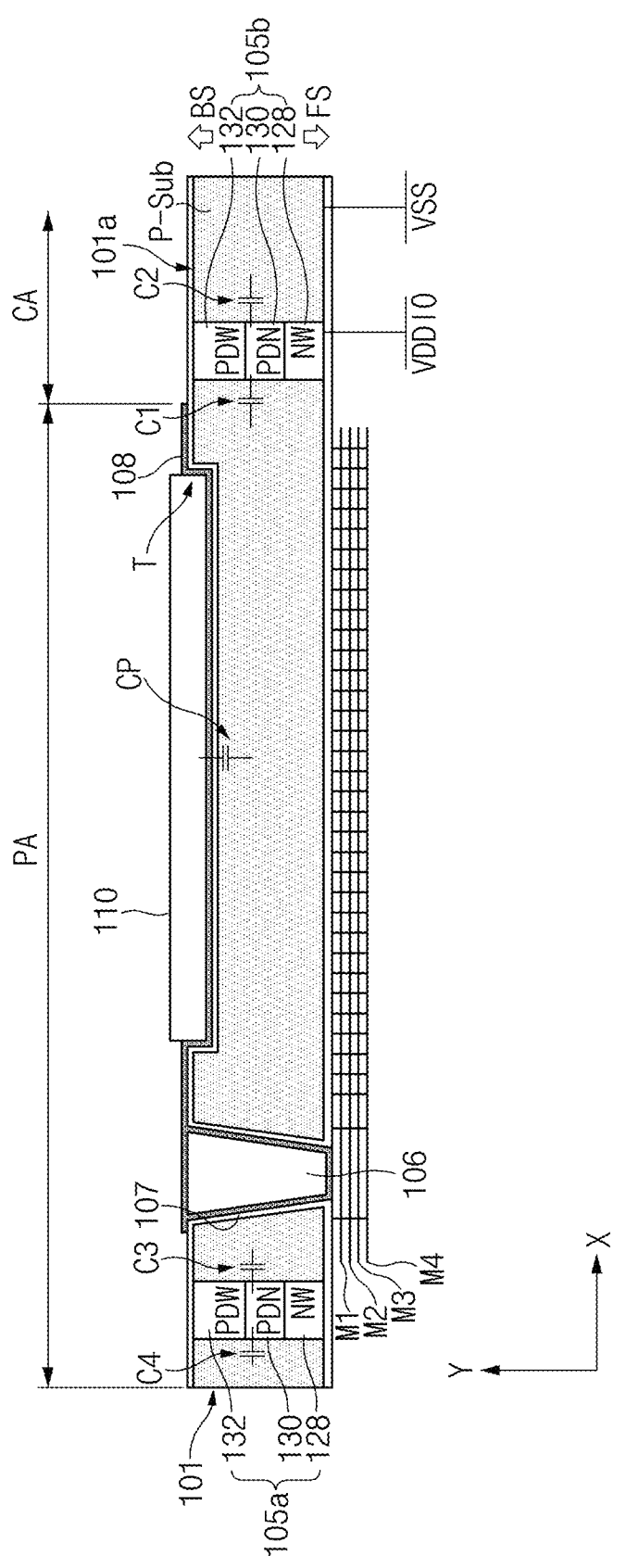

FIG. 8 is a cross-sectional view illustrating another example of the image sensor device shown in FIG. 1 based on various implementations of the disclosed technology. In FIG. 8, the same constituent elements as those of FIG. 6 will be used to refer to the same or like parts for convenience of description and better understanding of the disclosed technology, and as such redundant matters thereof will herein be omitted for brevity.

Referring to FIG. 8, each of the impurity areas 105a and 105b may be formed as a stacked structure of a plurality of doped areas. For example, each of the impurity areas 105a and 105b may include an impurity layer (NW) 128, an impurity layer (PDN) 130, and an impurity layer (PDW) 132.

The impurity areas 105a and 105b may not be disposed in a lower area of the pad 110 with respect to a Y-axis direction. The impurity areas 105a and 105b may be disposed at both ends of the substrate 101.

That is, each of the impurity areas 105a and 105b may be formed in a dam (or bar shape) structure, such that the dam-shaped impurity areas 105a and 105b may be disposed in both ends of the substrate 101. One impurity area 105a may be formed at one side of the substrate 101 in the X-axis direction. The other impurity area 105b may be formed at the other side of the substrate 101 in the X-axis direction.

That is, the impurity area 105a may be disposed in the outer edge area of the through silicon via (TSV) 106 in the X-axis direction. The impurity area 105b may be disposed in the outer edge area of the pad area PA in the X-axis direction. For example, the impurity area 105b may be disposed in the circuit area CA. In some implementations, the impurity area 105b may also be disposed in the pad area PA not the circuit area CA in the X-axis direction as necessary. Each of the impurity areas 105a and 105b may be smaller than the pad 110 in the X-axis direction.

Each of the impurity areas 105a and 105b may allow parasitic capacitance (CP) to be transferred from the pad 110 to the substrate 101. Parasitic capacitances C1 and C2 may be transferred from the substrate 101 to the impurity area 105b. Parasitic capacitances C3 and C4 may be transferred from the substrate 101 to the impurity area 105a.

Thus, the impurity area 105b may include parasitic capacitance (CP) and two capacitances C1 and C2, such that the impurity area 105b may be formed by serial connection of a total of three capacitances CP, C1 and C2. Therefore, total capacitance of the substrate 101 can be reduced not only by the parasitic capacitance (CP), but also by the smaller one of two parasitic capacitances C1 and C2.

The impurity area 105a may include parasitic capacitance (CP) and two capacitances C3 and C4, such that the impurity area 105a may be formed by serial connection of a total of three capacitances CP, C3 and C4. Therefore, total capacitance of the substrate 101 can be reduced not only by the parasitic capacitance (CP), but also by the smaller one of two parasitic capacitances C3 and C4.

Figure 9:
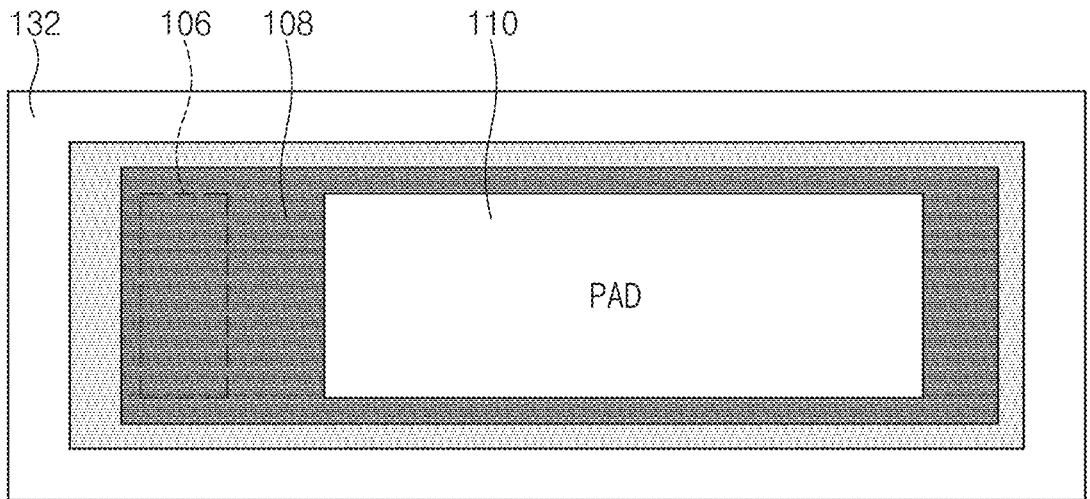
FIG. 9 is a plan view illustrating an example of the image sensor device shown in FIG. 8 based on various implementations of the disclosed technology.

FIG. 9 is a plan view illustrating an example of the image sensor device shown in FIG. 8 based on various implementations of the disclosed technology. In more detail, FIG. 9 is a schematic plan view illustrating constituent elements of the image sensor device shown in FIG. 8 for describing the arrangement relationship between the impurity layer 132 and the conductive film 108. In FIG. 9, the same constituent elements as those of FIG. 8 will be used to refer to the same or like parts for convenience of description and better understanding of the disclosed technology, and as such redundant matters thereof will herein be omitted for brevity.

Referring to FIG. 9, the pad 110 may be formed over the conductive film 108. The through silicon via (TSV) 106 may be formed below the conductive film 108. A fully-shaped second conductive impurity layer 132 may be formed in a peripheral area of the pad 110.

That is, the impurity areas 105a and 105b including the impurity layer 132 may be formed to omnidirectionally surround the conductive film 108. In other words, each of the impurity areas 105a and 105b including the impurity layer 132 may be formed in a rectangular band shape in which the center area includes the conductive film 108.

As is apparent from the above description, the image sensor device based on various implementations of the disclosed technology can reduce noise and parasitic capacitance of the pad area.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, those skilled in the art will understand that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An image sensor device comprising:
a substrate including a first surface and a second surface, the substrate being configured to have first conductive impurities;
a pad disposed at the first surface of the substrate; and
an impurity area including second conductive impurities different from the first conductive impurities, and disposed at both ends of the substrate with respect to a first direction within the substrate,
wherein the impurity area does not overlap with a lower area of the pad in a second direction.

2. The image sensor device according to claim 1, wherein the impurity area is formed to be smaller than the pad in the first direction.

3. The image sensor device according to claim 1, wherein the impurity region comprises a first impurity region formed at one side of the substrate in the first direction and a second impurity region formed at the other side of the substrate in the first direction.

4. The image sensor device according to claim 3, wherein the first impurity region is disposed not to overlap with the pad in the second direction in a pad region.

5. The image sensor device according to claim 3, wherein the second impurity region is disposed not to overlap with the pad in the second direction in a circuit area.

6. The image sensor device according to claim 3, wherein the second impurity region is disposed not to overlap with the pad in the second direction in a pad area.

7. The image sensor device according to claim 1, further comprising:

a conductive film disposed at the first surface of the substrate to cover a top surface of the substrate at a lower portion of the pad.

8. The image sensor device according to claim 7, wherein the conductive film is formed to be larger than the pad in the first direction.

9. The image sensor device according to claim 7, wherein the conductive film is formed in a trench exposing a plurality of areas of the substrate.

10. The image sensor device according to claim 9, wherein the pad is formed along a top surface and a side surface of the conductive film.

11. The image sensor device according to claim 7, further comprising:

a through silicon via disposed at one side of the substrate and being configured to penetrate the substrate in the second direction.

12. The image sensor device according to claim 11, wherein the through silicon via is electrically coupled to the pad through the conductive film.

13. The image sensor device according to claim 1, wherein the impurity area is formed as a stacked structure of a plurality of impurity layers.

14. The image sensor device according to claim 13, wherein the plurality of impurity layers is formed to have a same dimension in the second direction.

15. The image sensor device according to claim 13, wherein at least one of the plurality of impurity layers is formed as a deep well.

* * * * *